(12) United States Patent
Ishikawa et al.

(10) Patent No.: US 7,405,478 B2
(45) Date of Patent: Jul. 29, 2008

(54) SUBSTRATE PACKAGE STRUCTURE AND PACKAGING METHOD THEREOF

(75) Inventors: Katsumi Ishikawa, Takahama (JP); Hiroshi Takei, Anjo (JP); Nobuya Makino, Anjo (JP); Tetsuro Yano, Handa (JP)

(73) Assignee: DENSO CORPORATION, Kariya (JP)

( * ) Notice: Subject to any disclaimer, the term of this patent is extended or adjusted under 35 U.S.C. 154(b) by 243 days.

(21) Appl. No.: 11/282,836

(22) Filed: Nov. 21, 2005

(65) Prior Publication Data

US 2006/0113668 A1   Jun. 1, 2006

(30) Foreign Application Priority Data

Nov. 26, 2004   (JP) .............................. 2004-342115

(51) Int. Cl.
 *H01L 23/42*  (2006.01)
 *H01L 23/52*  (2006.01)
(52) U.S. Cl. ................. 257/737; 257/778; 257/E23.069
(58) Field of Classification Search ................. 257/737, 257/778, 777, E23.069
See application file for complete search history.

(56) References Cited

U.S. PATENT DOCUMENTS 4,878,611 A * 11/1989 LoVasco et al. ........ 228/180.22
5,186,383 A * 2/1993 Melton et al. .......... 228/180.22
5,220,200 A * 6/1993 Blanton ....................... 257/778
5,990,418 A * 11/1999 Bivona et al. ................ 174/546
6,310,421 B2 * 10/2001 Morishima ............... 310/313 R
2004/0212101 A1 * 10/2004 Pendse ........................ 257/781
2004/0217767 A1 * 11/2004 DiOrio et al. ................ 324/754

FOREIGN PATENT DOCUMENTS

| JP | A-4-340240 | 11/1992 |
| JP | A-6-204293 | 7/1994 |
| JP | A-9-232366 | 9/1997 |
| JP | A-2002-93848 | 3/2002 |
| JP | A-2002-261116 | 9/2002 |

* cited by examiner

*Primary Examiner*—Nitin Parekh
(74) *Attorney, Agent, or Firm*—Posz Law Group, PLC (57) ABSTRACT

A substrate package structure includes bumps disposed on a surface side of a first substrate and a surface side of a second substrate. The bump at the first substrate and the bump at the second substrate are press-fitted to each other while the one surface of the first substrate and the one surface of the second substrate are confronted to each other, thereby connecting the first and second substrates to each other. The bump at the first substrate is constructed so that the tip portion thereof is designed to have a flat surface, and the bump at the second substrate is constructed so that the tip portion is designed to have a projecting portion narrower than the tip portion of the bump at the first substrate.

5 Claims, 10 Drawing Sheets

SUBSTRATE PACKAGE STRUCTURE AND PACKAGING METHOD THEREOF

CROSS REFERENCE TO RELATED APPLICATION

This application is based upon, claims the benefit of priority of, and incorporates by reference the contents of Japanese Patent Application No. 2004-342115 filed on Nov. 26, 2004.

TECHNICAL FIELD

The technical field relates to a substrate package structure achieved by connecting two substrates each provided with a bump at one surface side thereof by press-fitting the bumps of the two substrates to each another, and a packaging method for the substrate package structure.

BACKGROUND

Figure 13A:
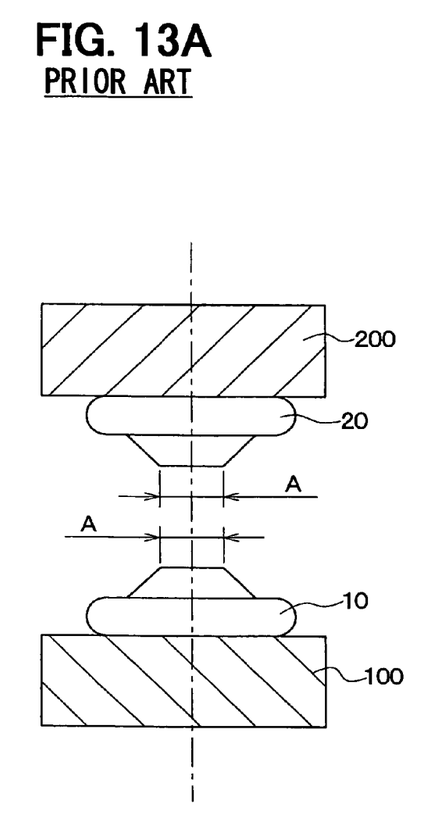
FIG. 13A is a cross-sectional view showing a state before two substrates are connected to each other.
Figure 13B:
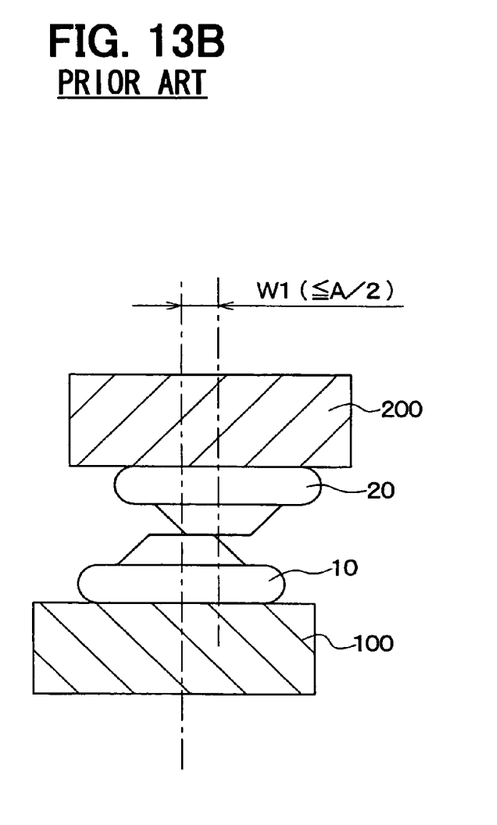
FIG. 13B is a cross-sectional view showing the packaged state of two substrates.

FIGS. 13A and 13B are diagrams showing a general substrate package structure of this type. Specifically, FIG. 13A is a cross-sectional view showing a state before two substrates 100 and 200 are connected to each other, and FIG. 13B is a cross-sectional view showing a state where the two substrates 100 and 200 are connected to each other, that is, a substrate packaged state.

As shown in FIG. 13A, the first substrate 100 at the lower side and the second substrate 200 at the upper side are disposed so as to confront each other at one surface sides thereof. Furthermore, a bump 10, 20 formed of gold or the like by a ball bonding method is provided on one surface of each of the first and second substrates 100 and 200.

In order to package both the substrates 100 and 200, the bump 10 at the first substrate 100 side and the bump 20 at the second substrate 200 side are positioned to each other while the one surface of the first substrate 100 and the one surface of the second substrate 200 are confronted to each other as shown in FIG. 13A, and then both the bumps 10 and 20 are press-fitted to each other as shown in FIG. 13B, whereby both the bumps 10 and 20 are connected to each other and the substrate package structure is formed.

Here, the bumps 10 and 20 of the substrates 100 and 200 are designed so that the widths A of the tip portions thereof are substantially equal to each other.

Therefore, a permissible value W1 for the positioning error of both the bumps 10 and 20 which is caused by a positional displacement of both the substrates 100 and 200 in the plane direction, in consideration of securing joining quality between the bumps 10 and 20, is equal to or less than a half (½) of the width A of the tip portion, that is, a value of A/2 or less. This is a narrow value.

When the permissible value W1 for the positioning error is narrow as described above, it is needed to carry out high-precision positioning while checking the bump connection portion by a visualizing device or the like, and the labor and cost needed for the positioning of both the substrates 100 and 200 are increased.

Therefore, there has been hitherto proposed a method for providing a wall to an electrode at the substrate side by plating or resist and carrying out the positioning through the wall (see JP-A-2002-261116). Furthermore, there have been also proposed a structure that a wall or dam is provided so as to prevent flow of resin to a portion of an element which is sensitive to stress applied when final resin sealing is carried out although it does not aim at the positioning (see JP-A-9-232366, JP-A-6-204293).

However, the positioning method disclosed in JP-A-2002-261116 is based on the assumption that the electrode is formed by plating and thus the cost is increased. Furthermore, the wall merely serves as a mark or guide, and it is designed under the restricted condition of the dimension of the electrode, and thus it does not contribute to facilitation of the positioning.

On the other hand, the wall or dam disclosed in JP-A-9-232366 or JP-A-6-204293 does not contribute to the positioning of the substrate, and has no object to facilitate the positioning in the substrate packaging work.

SUMMARY

In view of the foregoing problem, it is an object to facilitate the positioning of bumps of two substrates and properly connect both the bumps concerned in a substrate package structure achieved by press-fitting the bumps provided on one surface sides of the two substrates to each other, thereby connecting the two substrates to each other.

In order to attain the above object, according to first and second aspects, there is provided a substrate package structure in which bumps are provided on one surface sides of a first substrate and a second substrate, and the bump at the first substrate side and the bump at the second substrate are press-fitted to each other while the one surface of the first substrate and the one surface of the second substrate are confronted to each other, thereby connecting the two substrates to each other, wherein the bump at the first substrate side is constructed so that the tip portion thereof is designed to have a flat surface, and the bump at the second substrate side is constructed so that the tip portion is designed to have a projecting portion narrower than the tip portion of the bump at the first substrate side.

According to the substrate package structure of the first and second aspects, the width of the tip portions of the bumps of both the substrates can be defined so that the tip portion of the bump at the second substrate side is located within the range of the tip portion of the bump at the first substrate side even when a positional displacement occurs in the plane direction between both the substrates under the state that the one surface of the first substrate and the one surface of the second substrate are confronted to each other.

That is, even when a positional displacement occurs in the plane direction between both the confronting substrates, the projecting portion as the tip portion of the bump at the relatively narrow second substrate can be easily properly positioned onto the flat portion as the tip portion of the bump at the relatively broad first substrate side.

As described above, the positioning precision of both the substrates is moderated, and the positional displacement concerned can be made to be easily absorbed. Therefore, it is unnecessary to carry out the positioning while checking the bump connection portion with a visualizing device or the like, and the positioning can be readily performed.

Accordingly, in the substrate package structure in which the two substrates provided with the bumps at the one surface sides thereof are connected to each other by press-fitting the bumps concerned to each other, the positioning of the bumps of the two substrates is facilitated, and the bumps can be properly connected to each other.

Here, according to a third aspect, in the substrate package structure of the first aspect, the width B of the tip portion of the bump at the first substrate is set to 2.5 times or more of the width A of the tip portion of the bump at the second substrate side.

As described above, the width B of the tip portion of the bump at the first substrate side is set to 2.5 times or more of the width A of the tip portion of the bump at the second substrate side, whereby the effects of the first and second embodiments can be properly achieved.

Furthermore, according to a fourth aspect, in the substrate package structure of the first to third aspects, the bumps may be gold bumps.

According to a fifth aspect, in a substrate package structure in which bumps are provided on one surface sides of a first substrate and a second substrate, and the bump at the first substrate and the bump at the second substrate are press-fitted to each other under the state that the one surface of the first substrate and the one surface of the second substrate are confronted to each other, thereby connecting the first substrate and the second substrate, projections are provided to the one surface sides of the first substrate and the second substrate, and both the substrates are arranged so that the projections of both the substrates are engaged with each other, whereby both the substrates can be positioned to each other.

According to the fifth aspect, the positioning of both the substrates is readily carried out by using as eye marks the projections provided to both the substrates, respectively. Therefore, it is unnecessary to carry out the positioning while checking the bump connection portion by a visualizing device or the like, and the positioning can be easily performed.

Accordingly, in the substrate package structure that the two substrates provided with the bumps at the one surface sides thereof are connected to each other by press-fitting the bumps to each other, the positioning of both the bumps of the two substrates can be facilitated, and the bumps concerned can be properly connected to each other.

Here, according to a sixth aspect, in the substrate package structure of the fifth aspect, it is preferable that a wall portion is formed around the whole periphery of the peripheral portions of both the substrates between both the substrates by the projections of both the engaged substrates, thereby preventing invasion of foreign materials into the inner periphery of the wall portion by the wall portion.

According to the sixth aspect, the wall portion formed by the engaging substrates of both the substrates is constructed as a wall for preventing invasion of foreign materials into the inner peripheral side, so that the invasion of the foreign materials from the external can be properly prevented and the reliability can be enhanced.

According to a seventh aspect, a substrate packaging method of providing bumps to one surface side of a first substrate and one surface side of a second substrate, and press-fitting the bump at the first substrate and the bump at the second substrate side to each other while the one surface of the first substrate and the one surface of the second surface are confronted to each other, thereby connecting to connect the first and second substrates to each other, has the following features.

That is, in the step of forming the bump of the first substrate side, a ball formed by a wire is formed at the tip portion of a capillary by a ball bonding method, the ball is pressed against a pad of the first substrate through the capillary, and then the tip portion of the deformed ball is cut at the tip portion of the capillary, whereby a bump having a flat face at the tip portion thereof is formed as the bump at the first substrate side.

In the step of forming the bump at the second substrate, the ball formed by the wire is formed at the tip portion of the capillary by the ball bonding method, the ball is pressed against the pad of the second substrate through the capillary, and then a part of the wire located at the tip portion of the deformed ball is cut at the tip portion of the capillary, whereby a bump whose tip portion is a narrower projecting portion than the tip portion of the bump at the first substrate is formed as the bump at the second substrate side.

According to the substrate packaging method having the above features, the substrate package structure of the first aspect can be properly formed.

BRIEF DESCRIPTION OF THE DRAWINGS

The above and other objects, features and advantages will become more apparent from the following detailed description made with reference to the accompanying drawings:

FIGS. 5A to 5C are diagrams showing a method of calculating the width of the projecting portion as the tip portion of the bump at the second substrate side, wherein

FIGS. 6A and 6B are diagrams showing a method of calculating the width B of a flat portion as the tip portion of a bump at a first substrate side, wherein

FIGS. 13A and 13B are diagrams showing this type of general substrate package structure, wherein

DETAILED DESCRIPTION OF THE PREFERRED EMBODIMENTS

Numerals and signs in parentheses for each means described below are an example showing a corresponding relation with concrete means described in the following embodiments.

Preferred embodiments will be described hereunder with reference to the accompanying drawing. In the drawings, the same or equivalent parts are represented by the same reference numerals in order to simplify the description.

Figure 1:
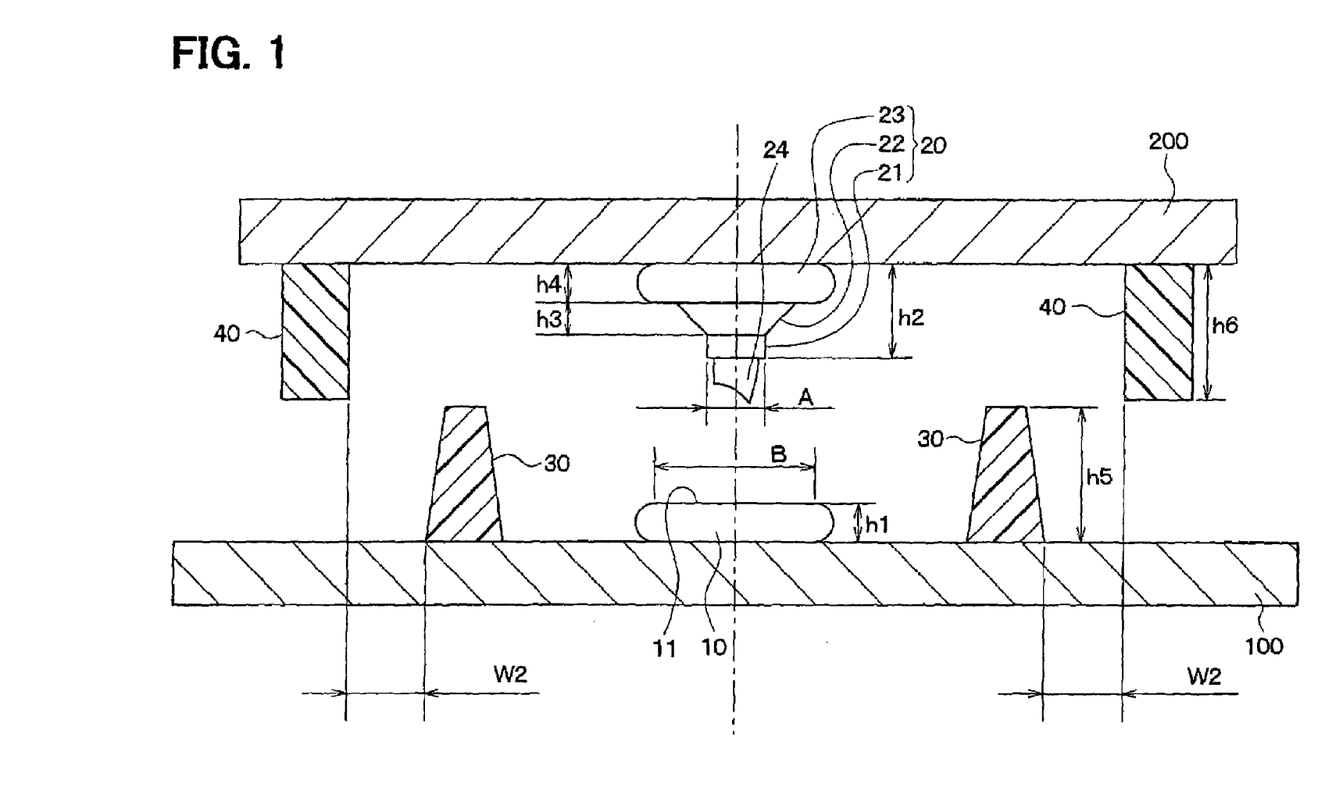
FIG. 1 is a cross-sectional view showing a state before two substrates are connected to each other in a substrate package structure according to an embodiment.
Figure 2:
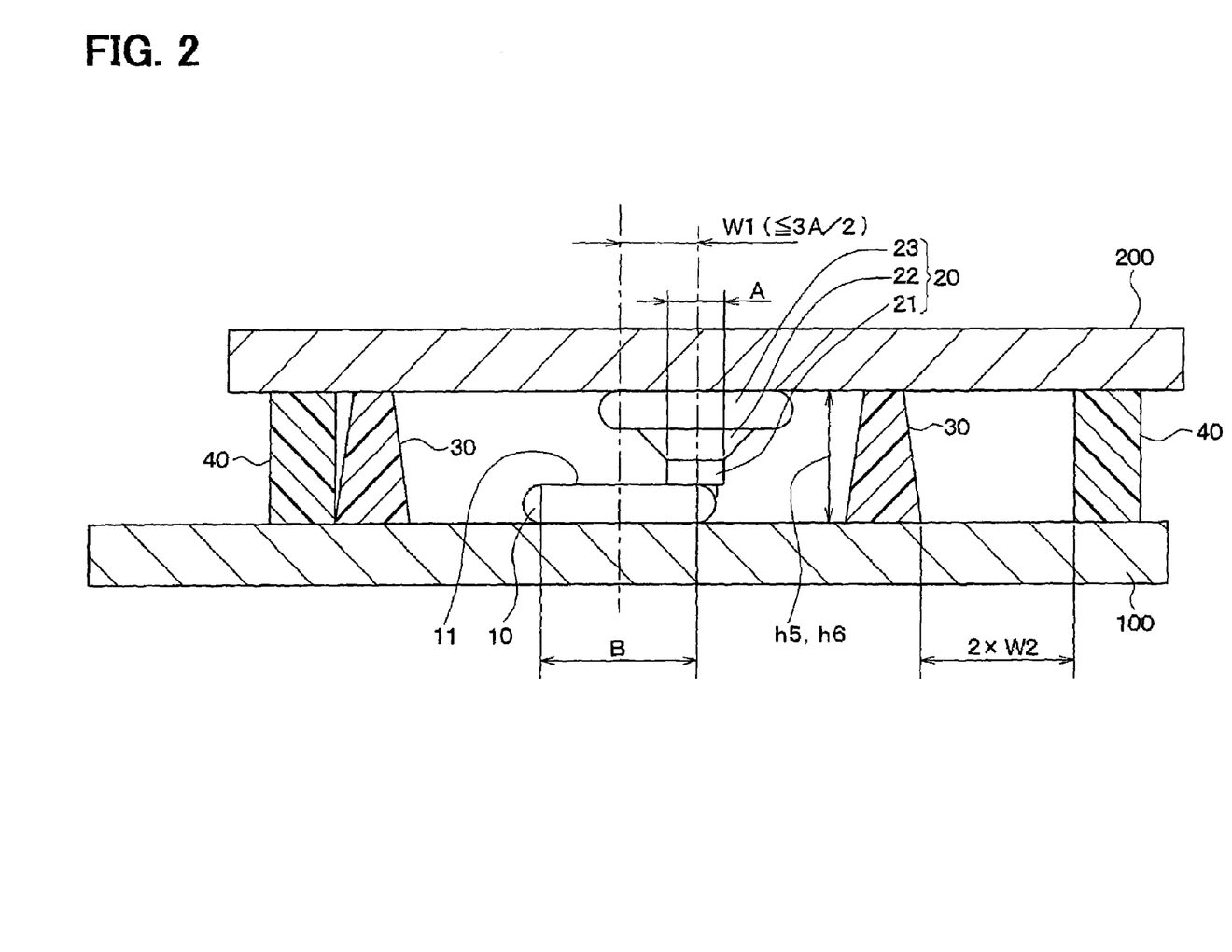
FIG. 2 is a cross-sectional view showing the substrate package structure according to the embodiment.

FIG. 1 is a cross-sectional view showing a state before two substrates 100 and 200 are connected to each other in a substrate package structure (see FIG. 2) according to an embodiment, and FIG. 2 is a cross-sectional view showing a state after the two substrates 100 and 200 are connected to each other in the substrate package structure. In this case, the lower substrate 100 is set as a first substrate 100, and the upper substrate 200 is set as a second substrate 200 in FIGS. 1 and 2.

As shown in FIG. 1, in the substrate package structure of this embodiment, bumps 10, 20 are provided on one surface sides of the first substrate 100 and the second substrate 200, and the bump 10 at the first substrate 100 side and the bump 20 at the second substrate 200 side are press-fitted to each other under the state that the one surface of the first substrate 100 and the one surface of the second substrate 200 are confronted to each other, thereby connecting the first substrate 100 and the second substrate 200 to each other.

Here, the second substrate 200 at the upper side may be constructed as a sensor chip in which an element for detecting acceleration, angular velocity, pressure, temperature, humidity, light, flow rate, gas or the like is formed on one surface side thereof, for example.

More specifically, the second substrate 200 is formed of a silicon semiconductor substrate or the like, and a movable portion having a comb-shape, a diaphragm, etc. for detecting a dynamic quantity, and a sensing portion such as an element or the like by a semiconductor manufacturing technique.

In the second substrate 200, the bump 20 is formed of gold bump, and this bump 20 is formed on a pad of aluminum or the like (not shown) by using a ball bonding method.

In the second substrate 200, the pad and the sensing portion are electrically connected to each other through a wire (not shown).

On the other hand, the first substrate 100 at the lower side is constructed a circuit chip, and it has a circuit for processing a detection signal emitted from the second substrate 200 as a sensor chip.

The first substrate 100 as the circuit chip described above is formed of a silicon semiconductor substrate or the like, and the circuit formed of transistor elements, etc. is constructed by using the semiconductor manufacturing technique.

In the first substrate 100, the bump 10 is formed of gold bump, and the bump 10 is formed on a pad of aluminum or the like (not shown) by using the ball bonding method. In the first substrate 100, the pad and the circuit are electrically connected to each other through a wire (not shown).

That is, in the substrate package structure of this embodiment, the second substrate 200 as the sensor chip and the first substrate 100 as the circuit chip are electrically connected to each other through the bumps 10 and 20, and the detection signal from the second substrate 200 is transmitted to the first substrate 100 through the bumps 10 and 20. The detection signal is subjected to signal processing there and then output to the external.

According to this embodiment, in the substrate package structure as described above, the bump 10 at the lower first substrate 100 side is designed so that the tip portion has a flat face, and the bump 20 at the upper second substrate 200 side is designed so that the tip portion has a projecting portion 21 narrower than the tip portion of the bump 10 at the first substrate 100 side as shown in FIG. 1.

More specifically, the bump 10 at the lower first substrate 100 side serves as a flat portion 11 whose tip portion has a flat face.

On the other hand, the bump 20 at the upper second substrate 200 side is constructed by a base portion 23, a taper portion 22 and a projecting portion 21 as the tip portion so as to be narrowed from the one surface side of the second substrate 200 to the tip portion.

Before the substrates 100 and 200 are connected to each other, a residual portion 24 of the wire cut by the ball bonding is formed at the tip of the projecting portion 21 as shown in FIG. 1.

Here, in this embodiment, the width B of the flat portion 11 as the tip portion of the bump 10 at the first substrate 100 side is preferably set to 2.5 times or more of the projecting portion 21 as the tip portion of the bump 20 at the second substrate 200.

As described above, the bumps 10 and 20 of both the substrates 100 and 200 can be formed by the ball bonding method. However, the bump forming method will be described with reference to FIGS. 3A to 3F and FIGS. 4A to 4E.

FIGS. 3A to 3F are diagrams of the process of a method of forming the bump 20 at the second substrate 200 side, the tip portion of the bump 20 being designed as the projecting portion 21, and FIGS. 4A to 4E are diagrams showing the process showing a method of forming the bump 10 at the first substrate 100 side, the tip portion thereof being designed as the flat portion 11. Here, in FIGS. 3A to 4E, these bumps 10 and 20 are formed on the pads 101 and 201 formed on one surfaces of the respective substrates 100, 200.

First, the method of forming the bump 20 at the second substrate 200 side by the ball bonding method will be described with reference to FIGS. 3A to 3F.

Figure 3A:
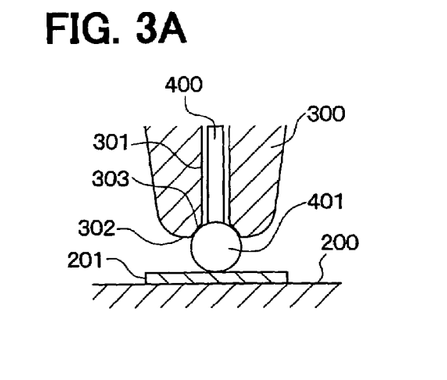
FIGS. 3A to 3F are diagrams showing a processing of forming a bump at a second substrate side whose end portion is designed as a projecting portion.

Electric discharging machining is carried out on a projecting portion of the gold wire 400 inserted in the hole 301 of the capillary 300 from the tip portion 302 of the capillary 300 to thereby form the spherical ball 401.

Under this state, the capillary 300 is downwardly moved to the pad 201 as shown in FIG. 3A to bring the ball 401 into contact with the pad 201 provided to one surface side of the second substrate 200.

Figure 3B:
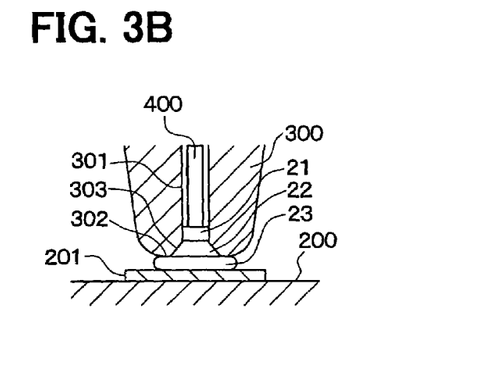

Subsequently, as shown in FIG. 3B, a load and ultrasonic wave are applied to the ball 401 through the capillary 300 to join the ball 401 and the pad 201 while plastically deforming the ball 401. Accordingly, the deformed ball 401 invades into the chamfer portion 303 and the hole 301 of the capillary 300, whereby the projecting portion 21, the taper portion 22 and the base portion 23 of the bump 20 are formed.

Figure 3C:
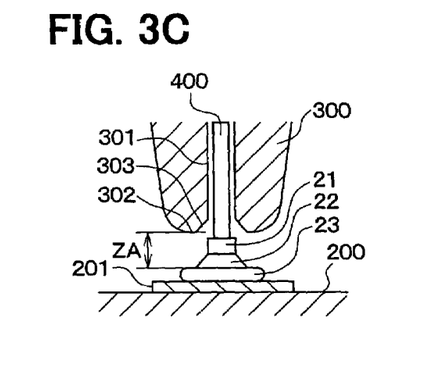
Figure 3D:
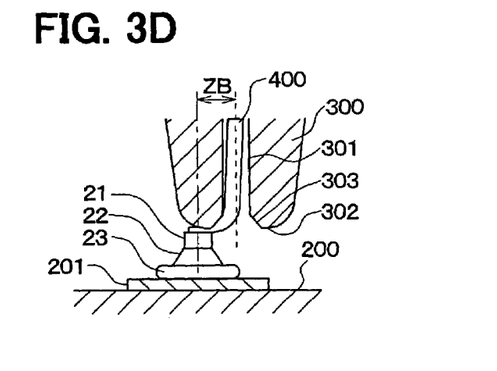

Subsequently, the capillary 300 is upwardly moved to the position of a set value ZA as shown in FIG. 3C, and then the capillary 300 is horizontally moved to the position of a set value ZB as shown in FIG. 3D. Through the above operation, a part of the gold wire 400 can be cut by the tip portion 302 of the capillary 300.

Figure 3E:
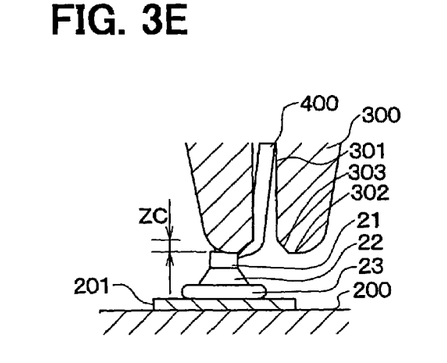

Subsequently, the capillary 300 is downwardly moved to the position of a set value ZC as shown in FIG. 3E to crush up the gold wire 400, form the projecting portion 21 of the bump 20 and facilitate pull-cut of the gold wire 400.

Figure 3F:
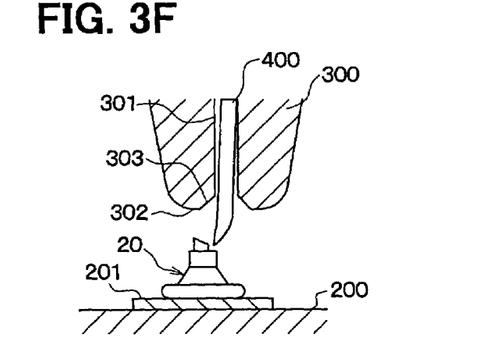

Subsequently, as shown in FIG. 3F, the gold wire 400 is pull-cut while upwardly moving the capillary 300. The formation of the bump 20 at the second substrate 200 side is completed by the pull-cut.

As described above, when the bump 20 at the second substrate 200 side of this embodiment is formed, ball bonding equipment and a gold wire can be diverted by adopting a stud bump technique, and thus neither dedicated equipment nor wire is required.

Next, the method of forming the bump 10 at the first substrate 100 side which is based on the ball bonding method will be described with reference to FIGS. 4A to 4E.

Figures 4A, 4B:
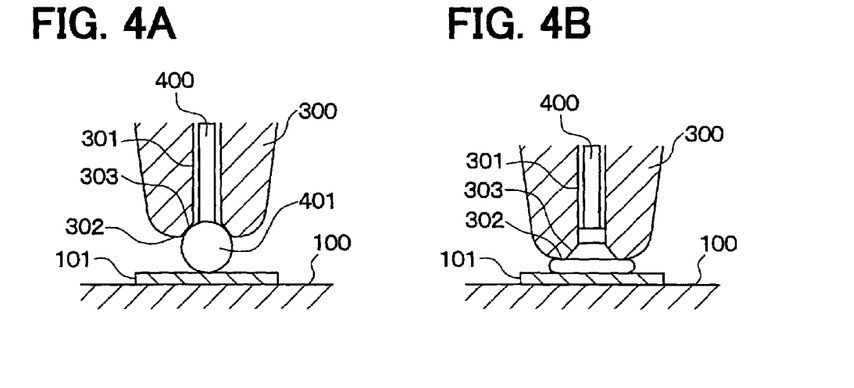
FIGS. 4A to 4E are diagrams showing a processing forming a bump at a first substrate side whose tip portion is designed as a flat portion.

First, electric discharge machining is carried out on a part of the gold wire 400 inserted in the hole 301 of the capillary 300 projecting from the tip portion 30, the part projecting from the tip portion 302 of the capillary 300, thereby forming the spherical ball 401.

Then, under this state, as shown in FIG. 4A, the capillary 300 is downwardly moved to the pad 101 to bring the ball 401 in contact with the pad 101 provided on the one surface side of the first substrate 100.

Subsequently, as shown in FIG. 4B, a load and ultrasonic wave is applied to the ball 401 through the capillary 300, and the ball 401 and the pad 101 are joined to each other while the ball 401 is plastically deformed.

Figures 4C, 4D:
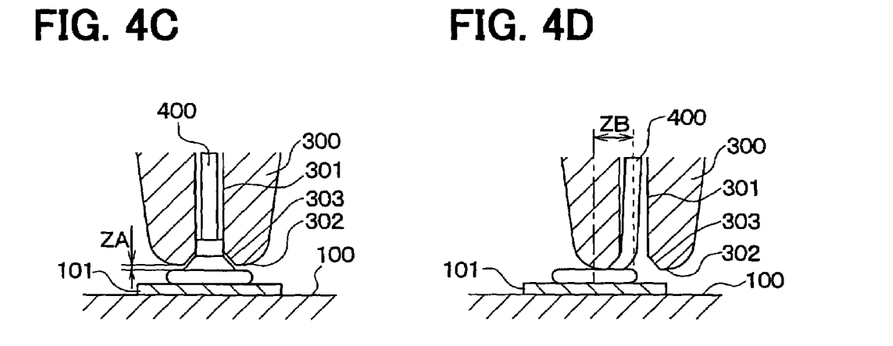

Then, as shown in FIG. 4C, the capillary 300 is upwardly moved to the position of the set value ZA by a minute amount. Even when the set value ZA is equal to zero, it would be unnecessary to move the capillary 300 upwardly in this step if the flat portion 11 of the bump 10 can be processed without difficulty.

Thereafter, as shown in FIG. 4D, the capillary 300 is horizontally moved to the position of the set value ZB, thereby cutting a part of the gold wire 400 by the tip portion 302 of the capillary 300.

Figure 4E:
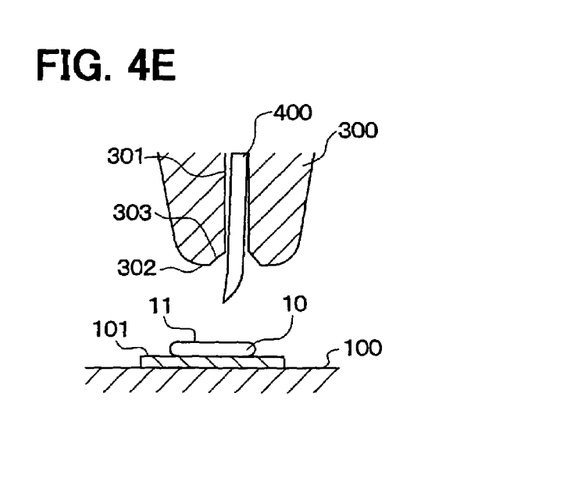

Subsequently, as shown in FIG. 4E, the gold wire 400 is pull-cut while upwardly moving the capillary 300. The formation of the bump 10 at the first substrate 100 side whose tip portion becomes the flat portion 11 is completed in connection with the above pull-cut.

As described above, when the bump 10 at the first substrate 100 side is formed in this embodiment, by adopting the stud bump technique, the ball bonding equipment and the gold wire can be diverted and thus neither dedicated equipment nor wire is needed. Furthermore, the leveling step for forming the flat portion 11 is unnecessary.

Furthermore, as shown in FIGS. 1 and 2, in the substrate package structure of this embodiment, the dams 30, 40 as the projections are provided on the one surfaces of the first and second substrates 100 and 200.

Furthermore, both the substrates 100 and 200 are arranged so that the dams 30 and 40 thereof are engaged with each other, whereby the positioning of the substrates 100 and 200 can be performed.

Specifically, the dam 30 at the first substrate 100 side and the dam 40 at the second substrate 200 side are designed so that the heights h5 and h6 thereof (see FIG. 1) are substantially equal to each other, and also they are arranged so as to be spaced from each other at an interval W2 under the positioning state of the bumps in design shown in FIG. 1 so that the dams are engageable with each other under the substrate packaged state.

The interval W2 between the dams 30 and 40 (see FIG. 1) is determined by considering the permissible value W1 for the positioning error between the bumps 10 and 20 of the substrates 100 and 200. That is, when the positional error (displacement) between the dams 30 and 40 is maximum, the interval between the dams 30 and 40 is equal to the double of W2 as shown at the right side of FIG. 2.

Even when the positional error between the dams 30 and 40 are maximum as described above, the positional error between the bumps 10 and 20 of the substrates 100 and 200 is set to be within the range of the permissible value W1, so that both the bumps 10 and 20 can be properly connected to each other.

As a method of forming the dams 30 and 40 may be adopted an organic film coating method based on (a) a photolithography method using optical etching processing, (b) an ink jetting method using coating processing based on the pressure of a piezoelectric element or the like, (c) a screen print method using print processing, (d) a dispense coating method using air pressure or the like.

As the organic material constituting the dams 30 and 40 as the projections may be used photosensitive film resist, photosensitive polyimide, photosensitive benzocyclobutene or the like for the method (a), and polyimide, polyamide, epoxy, acryl or the like for the methods (b), (c) and (d).

Next, the substrate package structure of this embodiment can be formed as follows. First, the first and second substrates 100 and 200 having the bumps 10 and 20 and the dams 30 and 40 formed thereon are prepared.

Then, when both the substrates 100 and 200 are packaged, the bump 10 at the first substrate 100 side and the bump 20 at the second substrate 200 side are positioned while one surface of the first substrate 100 and one surface of the second substrate 200 are confronted to each other as shown in FIG. 1, and then both the bumps 10 and 20 are press-fitted to each other as shown in FIG. 2. Accordingly, both the bumps 10 and 20 are connected to each other, and the substrate package structure shown in FIG. 2 is formed.

Here, as a method of assembling the first substrate 100 and the second substrate 200 may be used a thermal press-fitting method of applying only pressure to the substrates 100 and 200 under the state that the substrates are heated to 200° C. to 350° C., an ultrasonic press-fitting method of using heating at about 100° C. to 200° C. and ultrasonic wave in combination, or the like.

According to this embodiment, in the substrate package structure that the bumps 10 and 20 are provided at one surface sides of the first and second substrates 100 and 200 respectively, and the bump 10 at the first substrate 100 side and the bump 20 at the second substrate 200 are press-fitted to each other while one surface of the first substrate 100 and one surface of the second substrate 200 are confronted to each other, thereby connecting the first and second substrates 100 and 200, the bump 10 at the first substrate 100 side is designed so that the tip portion thereof has a flat surface, and the bump 20 at the second substrate 200 side is designed so that the tip portion thereof has a projecting portion 21 narrower than the tip portion of the bump 10 at the first substrate 100 side.

According to the substrate package structure described above, even when the positional displacement in the plane direction of the substrates 100, 200 occurs under the state that one surface of the first substrate 100 and one surface of the second substrate 200 are confronted to each other, the widths of the tip portions of the bumps 10 and 20 of the substrates 100 and 200 can be defined so that the tip portion of the bump 20 at the second substrate 200 side is located within the range of the tip portion of the bump 10 at the first substrate 100.

That is, even when a positional displacement in the plane direction of the confronting substrates 100 and 200 occurs, the relatively narrow projecting portion 21 corresponding to the tip portion of the bump 20 at the second substrate 200 side can be properly and easily positioned onto the relatively broad flat portion 11 corresponding to the tip portion of the bump 10 at the first substrate 100 side.

Accordingly, the positioning precision of the substrates 100 and 200 can be moderated, and the positional displacement (error) concerned can be easily absorbed. Therefore, it is unnecessary to carry out the positioning while checking the bump connection portion by a visualizing device or the like, and the positioning can be readily performed.

Accordingly, according to this embodiment, in the substrate package structure that the two substrates 100 and 200 having the bumps 10 and 20 formed at the one side surfaces thereof are connected to each other by press-fitting the bumps 10 and 20 to each other, the positioning of the bumps 10 and 20 of the two substrates 100 and 200 can be facilitated, and the bumps 10 and 20 can be properly connected to each other.

Here, as described above, according to this embodiment, the width B of the flat portion 11 corresponding to the tip portion of the bump 10 at the first substrate 100 side is preferable set to 2.5 times or more of the width A of the projecting portion 21 corresponding to the tip portion of the bump 20 at the second substrate 200 side.

The inventors of this application has confirmed that the positional displacement can be facilitated and the connection failure of the bumps 10 and 20 can be greatly reduced in the packaged structure of both the substrates 100 and 200 by defining the widths A and B as described above.

Furthermore, the logic behind why the width B of the flat portion 11 is set to 2.5 times or more of the width A of the projecting portion 21 are based on the fact that the bumps 10 and 20 are formed by the ball bonding as described above, and will be more specifically described with reference to FIGS. 5A to 6B.

Figure 5A:
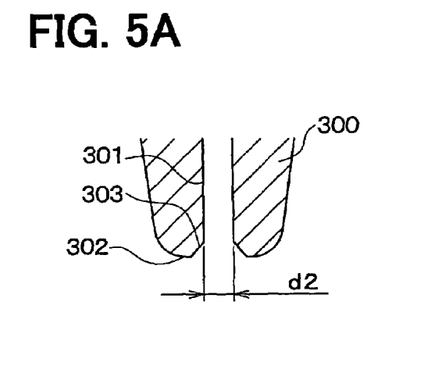
FIG. 5A is a cross-sectional view of a capillary.
Figure 5B:
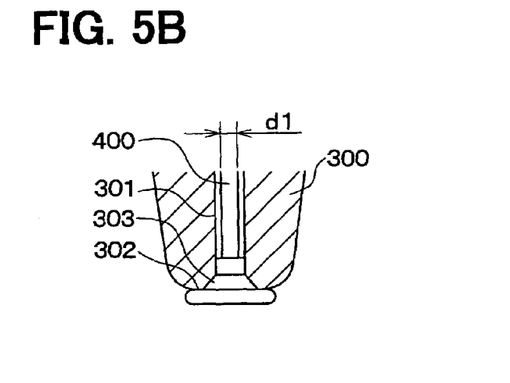
FIG. 5B is a cross-sectional view showing a state where a gold wire in the capillary is plastically deformed.
Figure 5C:
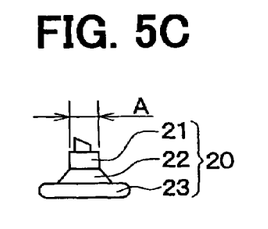
FIG. 5C is a cross-sectional view showing the bump at the second substrate side.

FIGS. 5A to 5C are diagrams showing the calculating method of the width A of the projecting portion 21 of the bump 20 at the second substrate 200 side, wherein FIG. 5A is a cross-sectional view showing the capillary 300, FIG. 5B is a cross-sectional view showing the state that the gold wire 400 in the capillary 300 is plastically deformed, and FIG. 5C is a cross-sectional view showing the bump 20 at the second substrate 200 side.

Figure 6A:
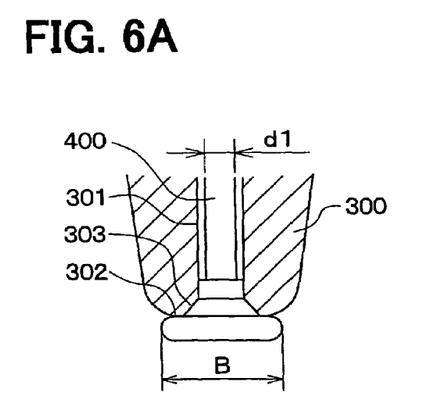
FIG. 6A is a cross-sectional view showing a state where a gold wire in a capillary is plastically deformed.
Figure 6B:
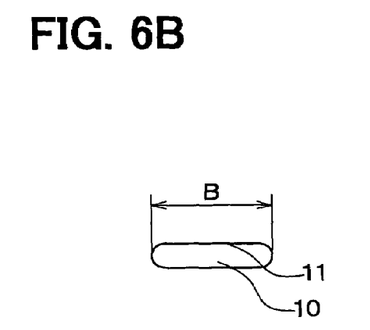
FIG. 6B is a cross-sectional view showing a bump at a first substrate side.

Furthermore, FIGS. 6A and 6B are diagrams showing the calculating method of the width B of the flat portion 11 of the bump 10 at the first substrate 100 side, wherein FIG. 6A is a cross-sectional view showing the state that the gold wire 400 in the capillary 300 is plastically deformed, and FIG. 6B is a cross-sectional view showing the bump 10 of at the first substrate 100 side.

First, the wire diameter d1 of the gold wire 400 used to form the bumps 10 and 20 is equal to several tens μm. In the following case, it is assumed that a gold wire 400 having a wire diameter d1 of 18 μm is used.

In the normal ball bonding method, the diameter d2 of the hole 301 of the capillary 300 (see FIG. 5A) is set to about 1.3 times the wire diameter d1 of the gold wire 400 in consideration of sliding of the gold wire 400 in the capillary 300.

The width A of the projecting portion 21 of the bump 20 at the second substrate 200 side is determined in accordance with the diameter d2 of the hole 301 of the capillary 300, and thus the width A of the projecting portion 21 concerned is set to 18×1.3=23 μm, for example.

The flat portion 11 of the bump 10 at the first substrate 100 side is formed by the crush-up of the tip portion 302 of the capillary 300, and in the normal ball bonding, the width B of the flat portion 11 corresponding to the maximum bump diameter is normally equal to about four times of the wire diameter d1 of the gold wire 400. Therefore, the width B of the flat portion 11 is equal to 18 μm×4=72 μm. Therefore, the width B is equal to about three times the width A, and when further considering tolerance, etc., the width B of the flat portion 11 can be set to 2.5 times or more of the width A of the projecting portion 21. As described above, the effect of this embodiment can be properly achieved by defining the widths A and B as described above.

This embodiment is also characterized in that the bump 10 at the first substrate 100 side and the bump 20 at the second substrate 200 side are formed of gold bumps. Accordingly, the formation of the bumps 10 and 20 by the ball bonding can be properly performed as shown in FIGS. 3A-3F and 4A-4E.

Furthermore, according to this embodiment, as shown in FIGS. 3A to FIG. 4E, the substrate packaging method in which the bumps 10 and 20 are provided at one surface sides of the first and second substrates 100 and 200 and the first and second substrates 100 and 200 are connected to each other by press-fitting the bump 10 at the first substrate 100 side and the bump 20 at the second substrate 200 to each other while one surface of the first substrate 100 and one surface of the second substrate 200 are confronted to each other have the following features.

As shown in FIGS. 4A to 4E, in the step of forming the bump 10 at the first substrate 100 side, the ball 401 formed from the wire 400 is first formed at the tip portion of the capillary 300 by the ball bonding method.

Subsequently, after the ball 401 is pressed against the pad 101 of the first substrate 100 through the capillary 300, the tip portion of the deformed ball 401 is cut by the tip portion of the capillary 300, whereby the bump whose tip portion becomes the flat surface is formed as the bump 10 at the first substrate 100 side.

As shown in FIGS. 3A to 3F, in the step of forming the bump 20 at the second substrate 200 side, the ball 401 formed from the wire 400 is formed at the tip portion of the capillary 300 by the ball bonding method.

Subsequently, after the ball 401 is pressed against the pad 201 of the second substrate 200 through the capillary 300, a part of the wire 400 located at the tip portion of the deformed ball 401 is cut by the tip portion of the capillary 300, whereby the bump whose tip portion becomes the projecting portion 21 narrower than the tip portion of the bump 10 at the first substrate 100 side is formed as the bump 20 at the second substrate 200 side.

As described above, according to the substrate packaging method having the above features in the method of forming the bumps 10 and 20, the substrate package structure as shown in FIG. 2 can be properly formed.

According to this embodiment, in the substrate package structure that the bumps 10 and 20 are provided at one surface sides of the first and second substrates 100 and 200 respectively and the first and second substrates 100 and 200 are connected to each other by press-fitting the bump 10 at the first substrate 100 side and the bump 20 at the second substrate 200 side under the state that the one surface of the first substrate 100 and the one surface of the second substrate 200 are confronted to each other, the dams 30 and 40 as the projections are provided at one surface sides of the first and second substrates 100 and 200, and both the substrates 100 and 200 are arranged so that the dams 30 and 40 of the substrates 100 and 200 are engaged with each other, whereby the positioning of both the substrates 100 and 200 can be performed.

According to the substrate package structure, the dams 30 and 40 provided to the substrates 100 and 200 are used as eye marks, and thus the positioning between the substrates 100 and 200 can be readily performed. Therefore, it is unnecessary to carry out the positioning while checking the bump connection portion by a visualizing device or the like, and thus the positioning can be readily performed.

Accordingly, in the substrate package structure in which the two substrates 100 and 200 having the bumps 10 and 20 provided at one surface sides thereof are connected to each other by press-fitting the bumps 10 and 20 concerned, the positioning between the bumps 10 and 20 of the two substrates 100 and 200 can be facilitated and the bumps 10 and 20 can be properly connected to each other.

The effect of the substrate package structure of this embodiment based on the bumps 10 and 20 will be described with reference to FIGS. 1 and 2 while showing specific dimensions.

FIGS. 1 and 2 shows the following dimensions although some of the dimensions are described above. With respect to the bump 10 at the first substrate 100 side, the width of the flat portion 11 corresponding to the tip portion thereof is represented by B, and the height of the bump 10 is represented by h1.

With respect to the bump 20 at the second substrate 200 side, the width of the projecting portion 21 corresponding to the tip portion thereof is represented by A, the height of the overall bump 20 is represented by h2, the height of the taper portion 22 is represented by h3, and the height of the base portion 23 is represented by h4. The permissible value of the positioning of the bump 10 and 20 is represented by W1 (see FIG. 2).

The height of the dam 30 at the first substrate 100 side is represented by h5, the height of the dam 40 at the second substrate 200 side is represented by h6, the interval between the dams 30 and 40 under the state that the bumps are positioned in design (that is, the state that the centers of the bumps 10 and 20 are coincident with each other) is represented by W2 (see FIG. 1).

Here, the following dimensions are merely examples, and the present invention is not limited to these dimensions. For example, the substrate package structure may be designed under the following dimensional condition: the width B of the flat portion 11 of the bump 10 is set to 129 μm, h1 is set to 15 μm, the width A of the projecting portion 21 of the bump 20 is set to 43 μm, the height h2 of the whole bump 20 is set to 50 μm, the height h3 of the taper portion 22 is set to 13 μm, the height h4 of the base portion 23 is set to 15 μm, the height h5 of the dam 30 is set to 64.5 μm, the height h6 of the dam 40 is set to 64.5 μm and the interval W2 between the dams 30 and 40 is set to 64.5 μm.

Furthermore, in this case, the width B of the flat portion 11 of the bump 10 at the first substrate 100 side is set to three times the width A of the projecting portion 21 of the bump 20 at the second substrate 200 side. In order to secure the joint quality between the bumps 10 and 20, it is sufficient only that the center of the narrower projecting portion 21 of the bump 20 at the second substrate 200 side is located with the range of the broader flat portion 11 of the bump 10 at the first substrate 100 side.

Therefore, the maximum value of the permissible value W1 for the positioning error between the bumps 10 and 20 is set to 1.5 times the width A of the projecting portion 21, that is, 3A/2, and more specifically the permissible value W1 concerned is set to 43 μm×1.5=64.5 μm.

In this case, FIG. 2 shows a state where both the substrates 100 and 200 are displaced in the plane direction at maximum from the positioning state intended in design shown in FIG. 1.

Under this maximum positional displacement state, the upper dam 40 is corrected to the lower dam 30 at the left side portion and thus the interval between both the dams 30 and 40 is equal to zero as shown in FIG. 2. On the other hand, at the right side portion of FIG. 2, the interval between the dams 30 and 40 is equal to double the interval W2 of the dams 30 and 40.

As shown in FIG. 2, under this maximum positional displacement state, the center of the projecting portion 21 corresponding to the tip portion of the upper bump 20 and the center of the flat portion 11 corresponding to the tip portion of the lower bump 10 are displaced from each other by the distance corresponding to the permissible value W=64.5 μm, however, this positional displacement (positioning error) is within the permissible value W1, so that the joint performance between the bumps 10 and 20 can be secured.

Conventionally, as shown in FIG. 13, the widths of the tip portions of the bumps 10 and 20 are set to be equal to each other, and thus the permissible value W1 for the positioning error between the bumps 10 and 20 is equal to A/2. On the other hand, in this case, the permissible value W1 concerned is set to 3A/2, and thus the positional displacement which is three times as large as that of the conventional technique can be permitted.

As described above, according to this embodiment, the positioning precision of the substrates 100 and 200 can be moderated, and it is unnecessary to position both the substrates 100 and 200 while the bump connection portion is enlarged and checked by using the visualizing device unlike the prior art. Therefore, the positioning labor and cost can be reduced.

Furthermore, as described above, the positioning operation of the dams 30 and 40 makes it easy to position the bumps 10 and 20, and thus the bumps 10 and 20 can be properly joined to each other. The shapes of the bumps 30 and 40 are not limited to specific ones shown in FIGS. 1 and 2.

Figure 7A:
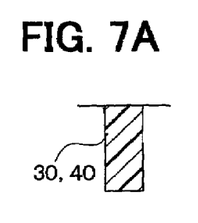
FIGS. 7A to 7E are diagrams showing the various kinds of overall cross-sectional shapes of a dam usable in the above embodiment.
Figure 7B:
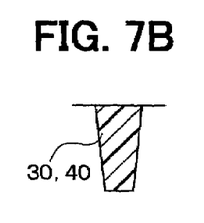
Figure 7C:
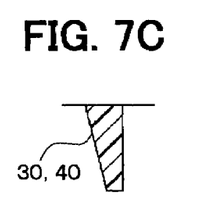
Figure 7D:
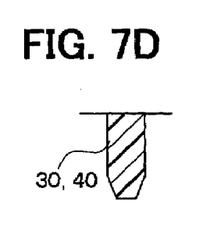
Figure 7E:
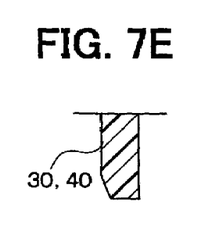
Figure 8A:
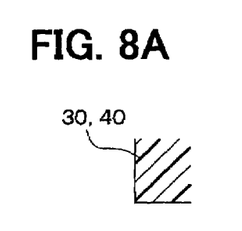
FIGS. 8A to 8C are diagrams showing various kinds of tip corner shapes of the dam usable in the above embodiment.
Figure 8B:
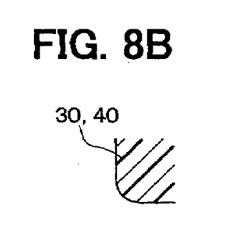
Figure 8C:
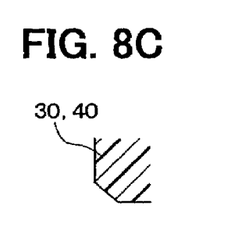

FIGS. 7A to 7E are diagrams showing various overall cross-sectional shapes of the dams 30 and 40 usable in this embodiment, and FIGS. 8A to 8C are diagrams showing various tip corner shapes of the dams 30 and 40 usable in this embodiment.

The rectangular shape shown in FIG. 7A and the trapezoidal shape shown in FIG. 7B are used for the dams 30 and 40 shown in FIGS. 1 and 2. However, a trapezoidal shape as shown in FIG. 7C, a tip double-side taper shape as shown in FIG. 7D, a tip one-side taper shape as shown in FIG. 7E or the like may be used as the shapes of the dams 30 and 40.

Furthermore, The tip corner portions of the dams 30, 40 may be designed in an angular shape as shown in FIG. 8A, in an R-shape as shown in FIG. 8B or in C-shape (chamfer shape) as shown in FIG. 8C. It is needless to say that various kinds of shapes as shown in FIGS. 7 and 8 may be combined and used for the dams 30 and 40.

Figure 9:
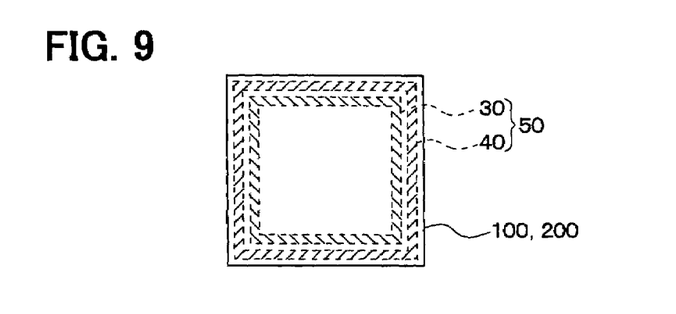
FIG. 9 is a plan view showing a plane pattern of a dam as a projection in the substrate package structure of the above embodiment.

FIG. 9 is a plan view showing the planar pattern of the dams 30, 40 as the projections in the substrate package structure of this embodiment. In FIGS. 9, 10 and 11, the dams 30 and 40 are hatched for the sake of convenience to easily identify the dams 30 and 40.

As shown in FIG. 9, each of the dam 30 at the first substrate 100 side and the dam 40 at the second substrate 200 side is provided on the overall periphery of the peripheral portion of each of the substrates 100, 200 between the substrates 100 and 200, thereby forming an annular planar pattern.

In the substrate package structure of this embodiment, the dams 30 and 40 each having the planar patter as described above are engaged with each other as shown in FIG. L2, whereby a wall portion 50 is formed on the overall periphery of the peripheral portion of the substrates 100, 200 between the substrates 100 and 200 by the engaged dams 30 and 40.

When the wall portion 50 is formed on the overall periphery as described above, the wall portion 50 serves as a wall for preventing invasion of foreign materials into the inner peripheral side of the wall portion, so that the invasion of the foreign materials from the external can be properly prevented, and reliability can be enhanced. Particularly, when there exists any site such as a movable portion, an element or the like which is remarkably affected by invasion of foreign materials on the inner periphery of the wall portion 50, the effect of the preventing invasion of foreign materials by the wall portion 50 is remarkable.

In order to prevent invasion of foreign materials by the wall portion 50 constructed by the dams 30 and 40 as described above, it is preferable that each of the dams 30 and 40 comes into contact with or adheres to one surface of the confronting substrate 100, 200 provided with the other dam.

Various contact states described below may be established as the contact state between each dam 30, 40 and the confronting substrate 100, 200.

Contact state 1: the tip portion of each of the dam 30 at the first substrate 100 side and the dam 40 at the second substrate 200 side is made to abut against one surface of the substrate 100, 200 at the other side and thermally deformed, whereby the dam concerned adheres to the one surface concerned.

Contact state 2: the tip portion of each of the dam 30 at the first substrate 100 side and the dam 40 at the second substrate 200 side is made to abut against one surface of the substrate 100, 200 at the other side and thermally deformed, however, the dam does not adhere to the one surface concerned.

Contact state 3: The tip portion of the dam 30 at the first substrate 100 side abuts against one surface of the second substrate 200, however, the tip portion of the dam 40 at the second substrate 200 side is disposed so as to be spaced from one surface of the first substrate 100 by a minute amount (for example, 0.5 μm or less).

Contact state 4: Contrarily to the contact state 3, the tip portion of the dam 40 at the second substrate 200 side is made to abut against one surface of the first substrate 100, however, the tip portion of the dam 30 at the first substrate 100 side is disposed so as to be spaced from one surface of the second substrate 200 by a minute amount (for example, 0.5 μm or less).

According to the contact state 1, an almost hermetic state can be established, and the invasion of foreign materials from the external can be prevented by 100%. When higher moisture resistance reliability is required, the overall package structure may be designed as a hermetic package.

According to the contact state 2, after the substrate packaging is completed, the dams 30 and 40 cool and contract by about $0.5/100$ to $1/100$, for example, so that a gap occurs between the dam 30, 40 and the substrate 100, 200 at the other side and the inner space in the wall portion 50 is equal to the external in pressure.

The dam 30, 40 does not adhere to the substrate 100, 200 at the other side, and thus even when the dams 30 and 40 are formed of materials having large linear expansion coefficients, no stress occurs in the substrates 100 and 200. Therefore, the reliability to the bump joint portion is excellent, and invasion of foreign materials having a prescribed size or more can be prevented. When higher moisture resistance reliability is required, the package structure may be designed as a hermetic package.

Under the contact state 3 and the contact state 4, with respect to elements such as MEMS product, etc. which would fall into functional failure if particles invade into the elements, invasion of particles, for example, of 0.5 μm or more in size, can be prevented by the wall portion 50, and thus it is expected that the functional failure can be suppressed. When higher moisture resistance reliability is required, the overall package structure may be designed as a hermetic package.

Here, in order to form the wall portion 50 having the foreign material invasion preventing effect, it is unnecessary to provide both the dams 30 and 40 on the overall periphery as shown in FIG. 9, and only one of the dams 30 and 40 may be provided on the overall periphery.

Furthermore, when it is unnecessary to form the wall portion 50 by both the dams 30 and 40, the dams 30 and 40 are not required to be provided on the overall periphery of the peripheral portion of each substrate, but may be partially provided on the periphery as shown in FIGS. 10A to 10F.

FIGS. 10A to 10F are plan views showing various examples of the planar pattern in which each of the dams 30 and 40 are disposed partially on the periphery of corresponding rectangular substrate 100, 200.

Figure 10A:
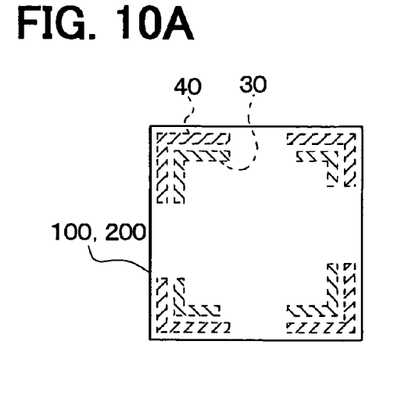
FIGS. 10A to 10F are plan views showing various examples of the plane pattern in which the dam is partially disposed at the peripheral portion of the substrate.
Figure 10B:
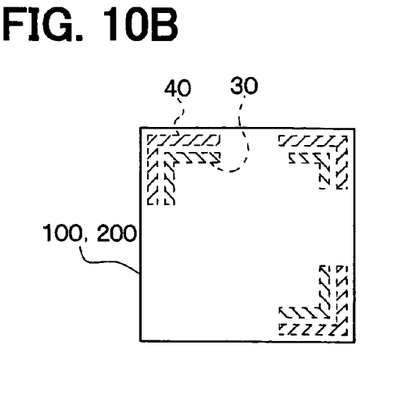
Figure 10C:
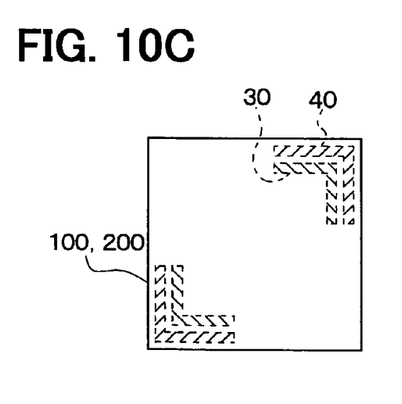
Figure 11A:
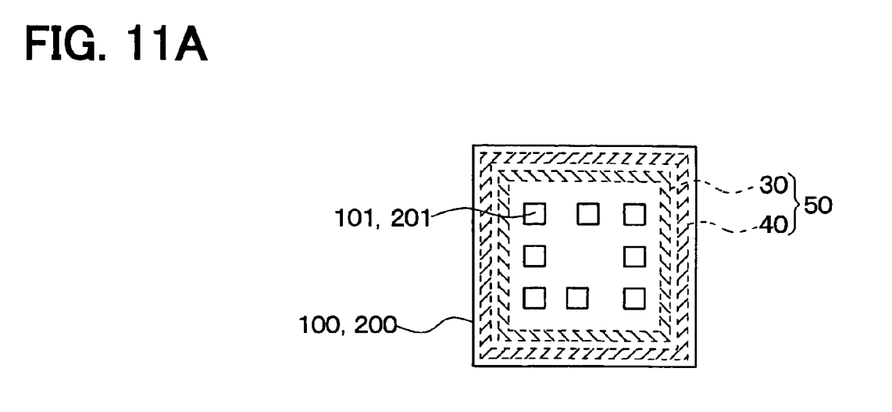
FIG. 11A is a plan view showing an arrangement example of pads when the dam is laid out on the overall periphery of the substrate peripheral portion.
Figure 11B:
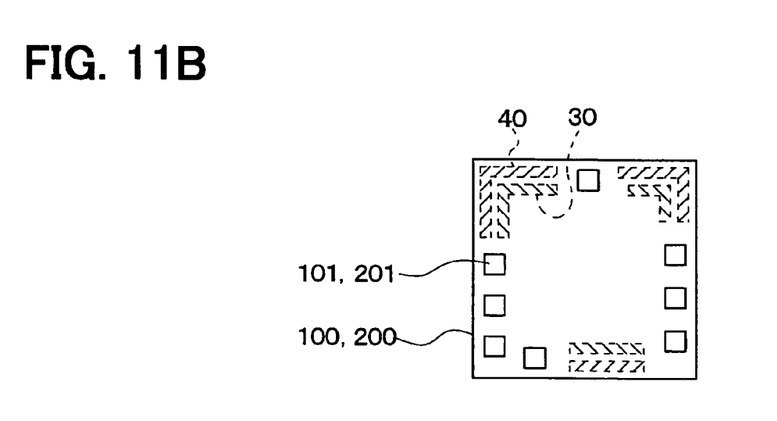
FIG. 11B is a plan view showing an arrangement example of pads when the dam is partially laid out at the substrate peripheral portion.

In the example shown in FIG. 10A, each of the dams 30, 40 is partially laid out at four corners of each of the substrates 100, 200. In the example of FIG. 10B, the dam 30, 40 is disposed partially at three corners of the substrate 100, 200. In the example of FIG. 10C, the dam 30, 40 is disposed partially at two diagonal corners of the substrate 100, 200.

Figure 10D:
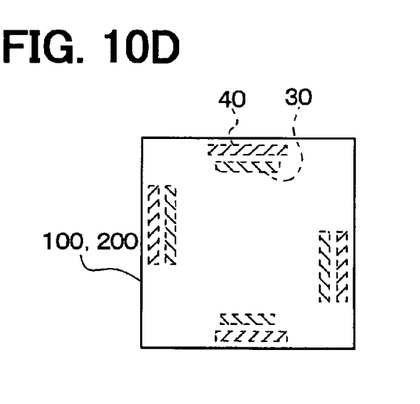
Figure 10E:
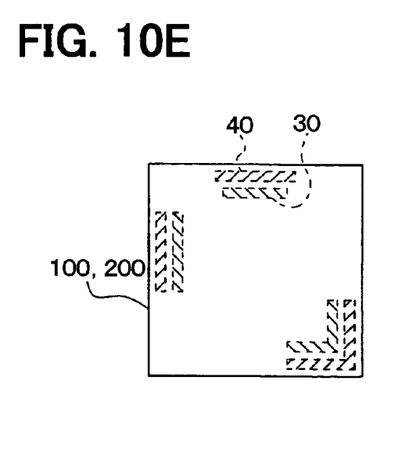
Figure 10F:
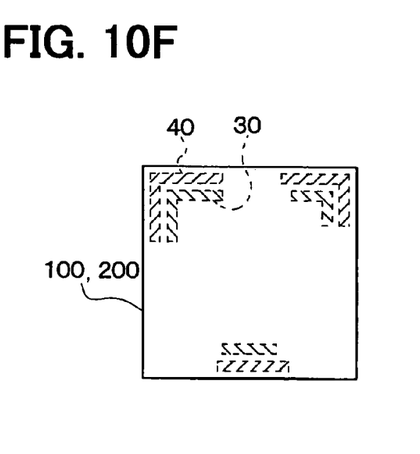

Furthermore, in the example of FIG. 10D, the dam 30, 40 is partially laid out at the centers of four side portions of the substrate 100, 200. In the example of FIG. 10e, the dam 30, 40 is disposed partially at the centers of two side portions of the substrate 100, 200 and at one corner of the substrate 100, 200. In the example of FIG. 10F, the dam 30, 40 is partially laid out at the center of one side portion of the substrate 100, 200 and at two corners of the substrate 100, 200.

Other partial lay-out patterns than those of FIGS. 10A to 10F may be adopted.

Here, when the dams 30, 40 are partially laid out as shown in FIGS. 11A and 11B, the degree of freedom of design for the arrangement of the pads 101, 201 in the substrates 100, 200 can be increased.

For example, when the dams 30 and 40 are laid out on the overall periphery of the substrate peripheral portion as shown in FIG. 11A, the pads 101 and 201 are disposed at the center portions of the substrates. However, by adopting the partial lay-out as shown in FIG. 11B, the pads 101 and 201 can be also disposed at the substrate peripheral portion.

In the cases of FIGS. 1, 2 and 9, each of the dam 30 at the first substrate 100 side and the dam 40 at the second substrate 200 side is disposed on a line. However, each of the dams 30 and 40 may be disposed on plural lines.

Figure 12A:
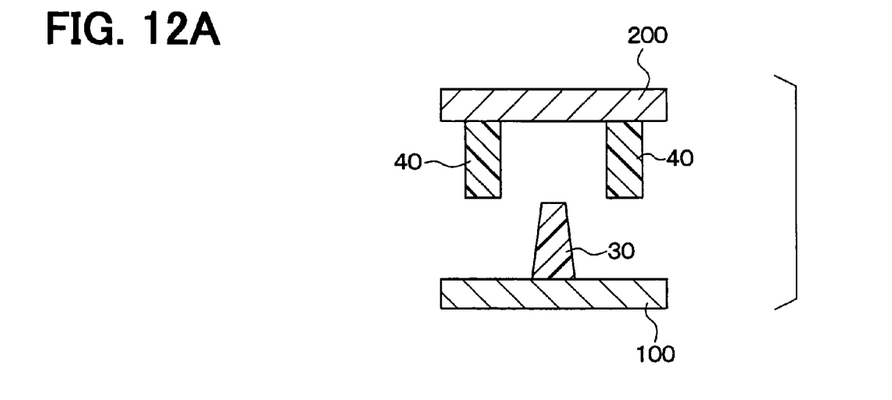
FIGS. 12A to 12C are cross-sectional views showing various kinds of examples in which plural dam arrays are provided.
Figure 12B:
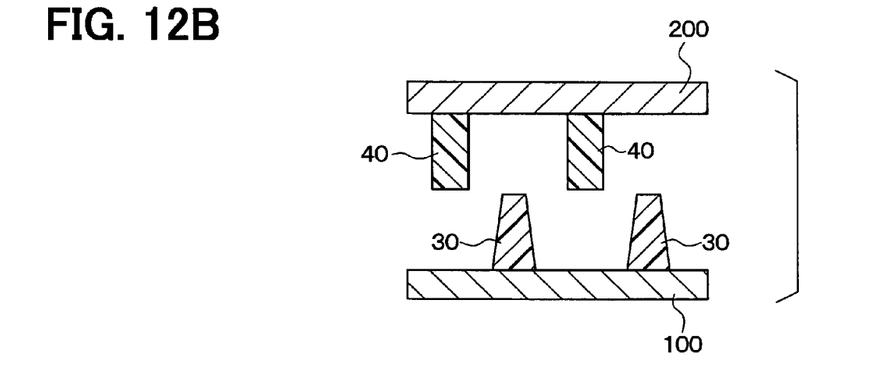
Figure 12C:
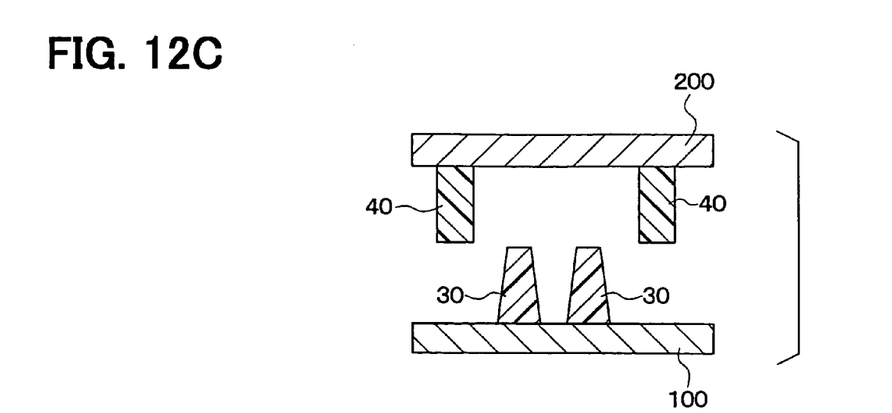

FIGS. 12A to 12C are cross-sectional vies showing various examples when each of the dams 30 and 40 is provided on plural lines. Specifically, it is illustrated in FIG. 12A that the dam 30 at the first substrate 100 side is provided on a line and the dam 40 at the second substrate 200 side is provided on two lines. However, in this case, the dam 30 at the first substrate 100 side is provided on an odd number of lines and the dam 40 at the second substrate 200 side is provided on an even number of lines.

Of course, the dam 30 at the first substrate 100 side may also provided on an even number of lines and the dam 40 at the second substrate 200 side provided on an odd number of lines. Furthermore, FIGS. 12B and 12C show arrangements when both the dam 30 at the first substrate 100 side and the dam 40 at the second substrate 200 side are provided on an odd number of lines or on an even number of lines.

Other Embodiments

In the above embodiment, the first substrate 100 is constructed as a circuit chip, and the second substrate 200 is constructed as a sensor chip. Conversely, the first substrate 100 may be constructed as a sensor chip while the second substrate 200 is constructed as a circuit chip.

Furthermore, both the first and second substrates 100 and 200 may be constructed as sensor chips or as circuit chips. That is, the first and second substrates 100 and 200 of the present invention are not limited to specific applications.

The terms first substrate and the second substrate merely mean one substrate of the two substrates and the other substrate of the two substrates, respectively. In the above embodiment, in FIGS. 1 and 2, the lower substrate 100 is set as the first substrate 100, and the upper substrate 200 is set as the second substrate 200. Conversely, in FIGS. 1 and 2, the lower substrate may be set as the second substrate while the upper substrate is set as the first substrate.

Therefore, in the above embodiment, the upper bump 20 has the projecting portion 21 and the lower bump 10 has the flat portion 11 in FIGS. 1 and 2. However, conversely, the upper bump may have the flat portion while the lower bump has he projecting portion.

In short, according to the present invention, any substrate package structure may be applied insofar as the substrate package structure is designed so that the bumps are provided to the confronting faces of the two confronting substrates, and the two confronting substrates are connected to each other by press-fitting the bumps.

Accordingly, the substrate package structure as described above has the main feature that the tip portion of the bump at one substrate side is designed to have a flat surface, and the tip portion of the bump at the other substrate side is designed to have a projecting portion narrower than the tip portion of the bump at the one substrate side, or the projections are provided to the confronting surfaces of the substrates and the two substrates are positioned by engaging the projections with each other, whereby the positioning of the bumps is facilitated. The other details than the above main feature may be properly changed in design.

What is claimed is:

1. A substrate package structure comprising:
   bumps disposed on a surface side of a first substrate and a surface side of a second substrate, the bump at the first substrate and the bump at the second substrate being press-fitted to each other while the one surface of the first substrate and the one surface of the second substrate are confronted to each other, thereby connecting the first and second substrates to each other, wherein the bump at the first substrate is constructed so that the tip portion thereof is designed to have a flat surface, and the bump at the second substrate is constructed so that the tip portion thereof is designed to have a projecting portion narrower than the tip portion of the bump at the first substrate,
   wherein a width of the tip portions and a displacement between centers of the tip portions of the bumps of both the substrates are defined so that a first center of the tip portion of the bump at the second substrate is located within a predetermined range of displacements from a second center of the tip portion of the bump at the first substrate even when a positional displacement occurs in a plane direction between both the substrates under the state that the surface of the first substrate and the surface of the second substrate are confronted to each other.

2. The substrate package structure according to claim 1, wherein the width of the tip portion of the bump at the first substrate is set to 2.5 times or more the width of the tip portion of the bump at the second substrate.

3. The substrate package structure according to claim 1, wherein the bumps are gold bumps.

4. The substrate package structure according to claim 1, wherein projections are provided to the surface sides of the first substrate and the second substrate, and both the substrates are arranged so that the projections of both the substrates are engaged with each other, whereby both the substrates are positioned to each other.

5. The substrate package structure according to claim 4, wherein a wall portion is formed around the whole periphery of the peripheral portions of both the first and second substrates between both the substrates by the projections of both the engaged substrates, thereby preventing invasion of foreign materials into an inner periphery of the wall portion by the wall portion.

* * * * *